US008243546B2

(12) United States Patent
Warren

(10) Patent No.: US 8,243,546 B2
(45) Date of Patent: Aug. 14, 2012

(54) SYSTEMS AND METHODS FOR PEAK POWER AND/OR EMI REDUCTION

(75) Inventor: Robert W. Warren, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 289 days.

(21) Appl. No.: 12/716,265

(22) Filed: Mar. 2, 2010

(65) Prior Publication Data
US 2011/0058421 A1 Mar. 10, 2011

Related U.S. Application Data

(60) Provisional application No. 61/240,533, filed on Sep. 8, 2009.

(51) Int. Cl.
*G11C 8/00* (2006.01)
(52) U.S. Cl. ............... 365/233.11; 365/233.13
(58) Field of Classification Search ............. 365/233.11, 365/233.13, 233.12, 227
See application file for complete search history.

(56) References Cited

U.S. PATENT DOCUMENTS

| 6,856,529 | B1 * | 2/2005 | Radke ........................ 365/49.18 |
| 7,127,549 | B2 | 10/2006 | Sinclair | |
| 7,310,699 | B2 | 12/2007 | Sinclair | |
| 2005/0172067 | A1 | 8/2005 | Sinclair | |
| 2007/0028040 | A1 | 2/2007 | Sinclair | |
| 2008/0267000 | A1 * | 10/2008 | Stark ........................ 365/233.1 |
| 2009/0067303 | A1 | 3/2009 | Poo | |
| 2009/0172280 | A1 | 7/2009 | Trika et al. | |
| 2010/0188910 | A1 * | 7/2010 | Kizer et al. ................ 365/193 |

FOREIGN PATENT DOCUMENTS
KR 10/2009/0013394 2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren, et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/772,005, filed Apr. 3, 2010, Warren, et al.
U.S. Appl. No. 12/774,065, filed May 5, 2010, Warren, Robert.
U.S. Appl. No. 12/774,077, filed May 5, 2010, Warren, Robert.

* cited by examiner

*Primary Examiner* — Vu Le
(74) *Attorney, Agent, or Firm* — Hamilton, DeSanctis & Cha

(57) ABSTRACT

Various embodiments of the present invention provide systems, methods and circuits for power management and/or EMI reduction. As one example, a method for memory system access is disclosed that includes providing a first bank of memory; providing a second bank of memory; receiving a memory access request that includes assertion of a reference memory clock; accessing the first bank of memory using a first sub memory clock asserted relative to the reference memory clock; delaying a phase offset; and accessing the second bank of memory using a second sub memory clock asserted the phase offset after assertion of the first sub memory clock.

20 Claims, 5 Drawing Sheets

SYSTEMS AND METHODS FOR PEAK POWER AND/OR EMI REDUCTION

CROSS REFERENCE TO RELATED APPLICATIONS

The present application claims priority to (is a non-provisional of) U.S. Pat. App. No. 61/240,533, entitled "Using Phased Clocks to Reduce Peak Power", and filed Sep. 8, 2009 by Warren. The entirety of the aforementioned provisional patent application is incorporated herein by reference for all purposes.

BACKGROUND OF THE INVENTION

The present inventions are related to systems and methods for power management, and more particularly to systems and methods for distributed power utilization and/or switching in a memory system.

Flash memories have been used in a variety of devices where information stored by the device must be maintained even when power is lost to the device. A typical flash memory exhibits a number of cells that can be charged to one of $2^N$ distinct voltage levels representing 'N' bits per cell. For example, a two bit cell may be charged to one of four distinct voltage levels each representing a corresponding two bit pattern (i.e., 00, 01, 10, 11). A typical flash memory bank may consist of a number of flash memory devices combined both in parallel and vertically to establish an overall memory size. For example, a number of eight-bit wide by 128K bit deep flash memory devices (i.e., 1M bit memory devices) may be assembled into a 64M bit memory that is sixty-four bits wide and 1M bit deep. In such a memory, sixty-four bit wide words are read/written on each access meaning eight of the flash memory devices are read/written on each access. In some cases, this can result in power management problems.

Hence, for at least the aforementioned reason, there exists a need in the art for advanced systems and methods for implementing memories.

BRIEF SUMMARY OF THE INVENTION

The present inventions are related to systems and methods for power management, and more particularly to systems and methods for distributed power utilization and/or switching in a memory system.

Various embodiments of the present invention provide electronic systems that include at least a first bank of flash memory and a second bank of flash memory. Access to the first bank of flash memory is synchronized by a first sub memory clock, and access to the second bank of flash memory is synchronized by a second sub memory clock. An access clock distributor circuit is included that is operable to provide the first sub memory clock to the first bank of flash memory and to provide the second sub memory clock to the second flash memory such that the second sub memory clock lags the first sub memory clock by a phase offset. In some instances of the aforementioned embodiments of the present invention, the first bank of flash memory comprises a plurality of flash memory devices. In various instances of the aforementioned embodiments of the present invention, the phase offset is non-zero.

In some instances of the aforementioned embodiments of the present invention, the access clock distributor circuit is operable to receive a reference clock, and wherein the access clock distributor circuit is operable to assert the first sub memory clock and the second sub memory clock relative to the reference clock. In some cases, the phase offset is a function of a total number of banks that are accessed in phases and a period of the reference clock. In particular cases, the phase offset is approximately three hundred sixty degrees divided by the total number of banks that are accessed in phases. In various cases, the phase offset is selected to represent a greater duration of the reference clock than the duration over which the peak power requirement of the first bank of flash memory extends. In various instances of the aforementioned embodiments of the present invention, the phase offset is selected such that a peak power requirement of the first bank of flash memory and a peak power requirement of the second bank of flash memory do not overlap in time.

In one or more instances of the aforementioned embodiments, the system further includes an access control circuit that is operable to align data received from the first bank of flash memory and the second bank of flash memory. In some such instances, the system further includes a host that is operable to receive data read from the first bank of flash memory and the second bank of flash memory via the access control circuit, and is operable to provide data to the first bank of flash memory and the second bank of flash memory via the access control circuit.

Other embodiments of the present invention provide methods for memory system access that include providing a first bank of memory; providing a second bank of memory; receiving a memory access request that includes assertion of a reference memory clock; accessing the first bank of memory using a first sub memory clock asserted relative to the reference memory clock; delaying a phase offset; and accessing the second bank of memory using a second sub memory clock asserted the phase offset after assertion of the first sub memory clock.

In some instances of the aforementioned embodiments of the present invention, the phase offset is a function of a total number of banks that are accessed in phases and a period of the reference memory clock. In particular cases, the phase offset is approximately three hundred sixty degrees divided by the total number of banks that are accessed in phases. In other instances of the aforementioned embodiments of the present invention, the phase offset is selected to represent a greater duration of the reference memory clock than the duration over which the peak power requirement of the first bank of memory extends. In one or more instances of the aforementioned embodiments of the present invention, the phase offset is selected such that a peak power requirement of the first bank of memory and a peak power requirement of the second bank of memory do not overlap. In some instances of the aforementioned embodiments of the present invention, the method further includes: receiving a first output from the first bank of memory; receiving a second output from the second bank of memory; and aligning the first output and the second output to yield a subset of a full data word.

Yet other embodiments of the present invention provide memory circuits that include a first bank of memory and a first sub memory clock, and a second bank of memory and a second sub memory clock. The first bank of memory is accessible using the first sub memory clock, and the second bank of memory is accessible using the second sub memory clock. The circuits further include an access clock distributor circuit that is operable to receive a reference memory clock, and the access clock distributor circuit is operable to assert the first sub memory clock relative to the reference memory clock and to assert the second sub memory clock a phase offset from the first sub memory clock.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
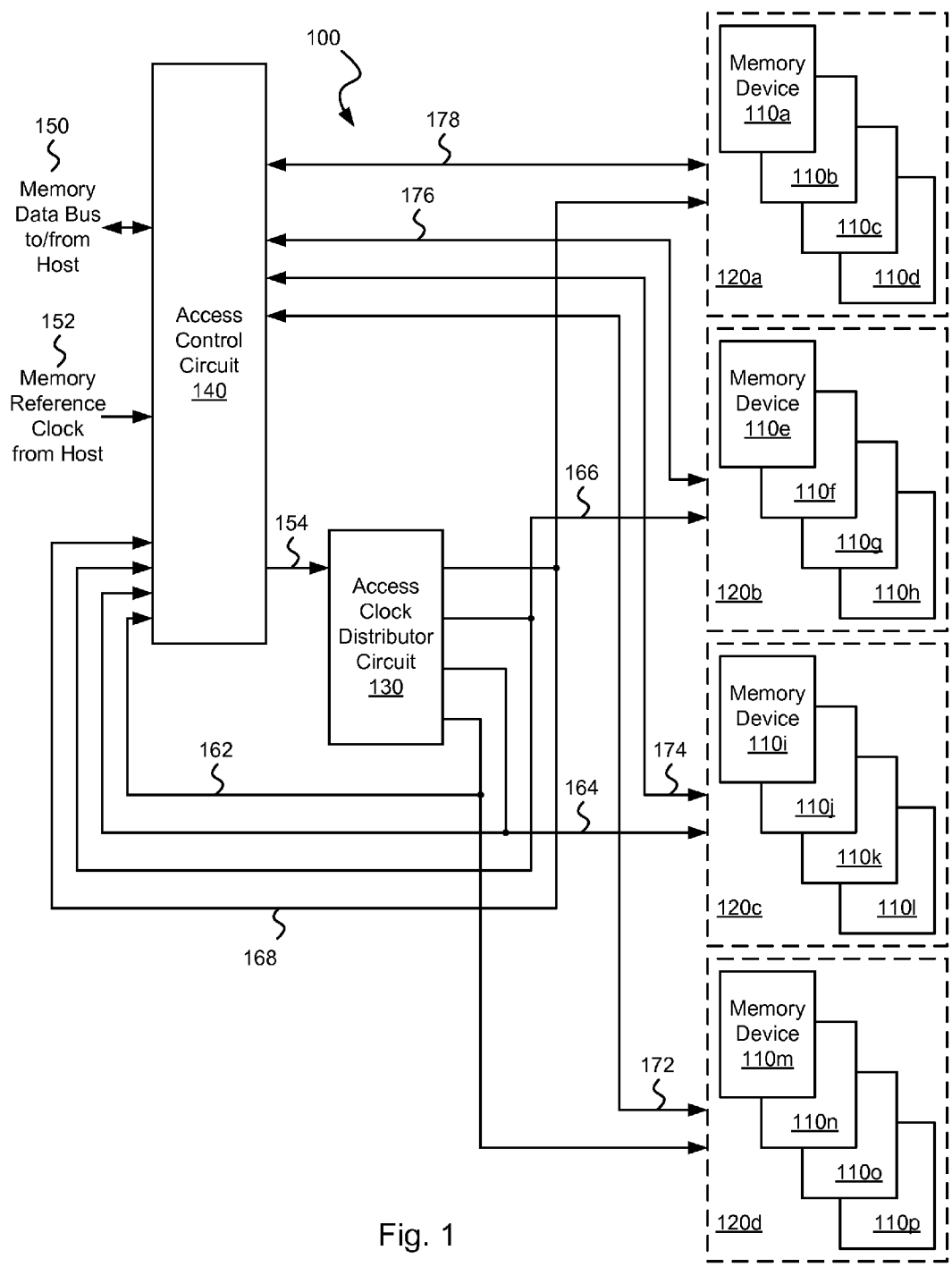
FIG. 1 depicts a memory system including multiple banks of memory devices that may be accessed under control of an access clock distributor circuit in accordance with various embodiments of the present invention.

The present inventions are related to systems and methods for power management, and more particularly to systems and methods for distributed power utilization and/or switching in a memory system.

Various embodiments of the present invention utilize phased clocks to distribute the overall peak power requirement of a memory system and/or to reduce electromagnetic interference (hereinafter "EMI"). In some cases, the timing of the clocks used to write data to or read data from memory may be phased such that different banks of memory are accessed at different phases. Such an approach is very effective in flash memory systems where a flash memory devices exhibit substantial power usage over a very limited period. By using phased clocks, the peak power requirement of a memory system may be reduced when compared with the situation where substantially simultaneous clocks are used to access the memory banks and/or peak EMI is reduced. Of note, while the peak power is reduced, the average power used remains substantially unchanged.

The amount of phase offset introduced between access clocks may be programmable, or may be fixed depending upon the particular embodiment of the present invention. Further, the amount of phase offset introduced may be selected depending upon particular design parameters. For example, in an eight bank memory system implemented using memory devices that exhibit a sharply increasing and decreasing power utilization distributed over five percent of the access clock period, the phase offset may be five percent or more so that the peak power usage of one memory bank is substantially complete before the period of peak power usage of a subsequent bank is introduced. In other cases, the three hundred, sixty degrees of the access clock period may be divided by the number of memory banks in the memory system, with the result being the approximate amount of phase offset introduced between each of the phased clocks provided to the respective memory banks. Based upon the disclosure provided herein, one of ordinary skill in the art will recognize a variety of phase offsets that may be introduced between clocks distributed to memory banks in accordance with the various embodiments of the present invention. By introducing such clock phasing, the peak power of the memory system may be approximately the peak power of any of the banks of the memory system rather than the peak power of a bank in the memory system multiplied by the number of memory banks.

As an example, a memory circuit is described that includes a first bank of memory and a first sub memory clock, and a second bank of memory and a second sub memory clock. The first bank of memory is accessible using the first sub memory clock, and the second bank of memory is accessible using the second sub memory clock. The circuits further include an access clock distributor circuit that is operable to receive a reference memory clock, and the access clock distributor circuit is operable to assert the first sub memory clock relative to the reference memory clock and to assert the second sub memory clock a phase offset from the first sub memory clock. As used herein the term "clock" is used in its broadest form to mean a signal that toggles from one assertion level to another. In some cases the clock may be a periodic clock where the toggling repeats at a defined period. In such a case, a phase offset may be expressed as a portion of the defined period. For example, a one hundred, eighty degree phase offset would indicate a shift of half of the defined period. In other cases the clock may be a non-periodic pulse. In such a case the period of the clock is the shortest period at which the toggling associated with the clock could be repeated if a number of memory accesses are serially performed. In such a case, a phase offset may be expressed as a portion of the shortest period. For example, a ninety degree phase shift would indicate a shift of one quarter of the shortest period.

Turning to FIG. 1, a memory system 100 including multiple banks 120 of memory devices 110 that may be written under control of an access clock distributor circuit 130 is shown in accordance with various embodiments of the present invention. Bank 120a includes four memory devices 110a, 110b, 110c, 110d that provide one subword (i.e., the width of memory devices 110) on each read cycle, and receives one subword on each write cycle. Thus, the size of bank is described by the following equation:

Bank Size=Subword*Depth of Memory Device*Number of Memory Devices.

Similarly, bank 120b includes four memory devices 110e, 110f, 110g, 110h; bank 120c includes four memory devices 110i, 110j, 110k, 110l; and bank 120d includes four memory devices 110m, 110n, 110o, 110p. Each of banks 120 has a subword width. Therefore, the overall width of memory system is described by the following equation:

Memory Width=Subword*Number of Banks.

Each of banks 120 is the same size (i.e., Bank Size), thus the overall memory size is described by the following equation:

Memory Size=Bank Size*Number of Banks.

In operation, each of banks 120 are accessed using a sub memory clock corresponding to that particular bank. In particular, a sub memory clock 168 is used to synchronize access to bank 120a; a sub memory clock 166 is used to synchronize access to bank 120b; a sub memory clock 164 is used to synchronize access to bank 120c; and a sub memory clock 162 is used to synchronize access to bank 120d. The respective sub memory clocks indicate the location of data on respective, corresponding sub memory data buses, 172, 174, 176, 178.

Access clock distributor circuit 130 generates sub memory clocks 162, 164, 166, 168 based upon an input reference clock 154. As a power management tool, each of the respective sub memory clocks 162, 164, 166, 168 may be phase shifted relative to one another. It should be noted that the phrases "phase shift" and "phase offset" are used interchangeably herein. In some embodiments of the present invention, the phase shift may be programmable, while in other cases, the phase shift may be fixed. As an example, in one embodiment of the present invention, a phase shift of between zero degrees and one hundred, eighty degrees may be selected to be applied between each of the produced sub memory clocks 162, 164, 166, 168. As another example, in one embodiment of the present invention where there are four banks, the phase shift may be fixed at exactly ninety degrees between each of the clocks (e.g., sub memory clock 162 is shifted zero degrees from input reference clock 154, sub memory clock 164 is shifted ninety degrees from input reference clock 154, sub memory clock 166 is shifted one hundred, eighty degrees from input reference clock 154, and sub memory clock 168 is shifted two hundred, seventy degrees from input reference clock 154). Based upon the disclosure provided herein, one of ordinary skill in the art will appreciate a variety of phase shifts between the sub memory clocks that may be used in relation to different embodiments of the present invention.

In addition to synchronizing access to banks 120, sub memory clocks 162, 164, 166, 168 are provided to an access control circuit 140 that governs both reads from and writes to banks 120. In a read operation, a memory reference clock 152 is provided to access clock distributor circuit 130 as input reference clock 154. In relation to memory reference clock 152, the requested data is received from sub memory data buses 172, 174, 176, 178 connecting access control circuit 140 and banks 120. The data on sub memory data bus 172 is synchronized to sub memory clock 162, the data on sub memory data bus 174 is synchronized to sub memory clock 164, the data on sub memory data bus 176 is synchronized to sub memory clock 166, and the data on sub memory data bus 178 is synchronized to sub memory clock 168. Access control circuit 140 uses each of sub memory clocks 162, 164, 166, 168 to govern registering data from the respective sub memory data buses 172, 174, 176, 178. The registered data may then be provided as an output via a memory data bus 150. Memory data bus 150 communicates data between a host (not shown) and memory system 100. The host may be any circuit known in the art that is capable of transferring data to memory system 100 and/or requesting data from memory system 100. As an example, the host may be a general purpose processor executing computer executable instructions to perform various tasks. Based upon the disclosure provided herein, one of ordinary skill in the art will recognize a variety of hosts that may be used in relation to different embodiments of the present invention.

In a write operation, memory reference clock 152 is provided to access clock distributor circuit 130 as input reference clock 154. In addition, access control circuit 140 registers the write data received via memory data bus 150 and provides the registered data as an output spread across sub memory data bus 172, sub memory data bus 174, sub memory data bus 176 and sub memory data bus 178. Access clock distributor circuit 130 generates sub memory clocks 162, 164, 166, 168 that are provided to respective banks 120 to synchronize the write.

Of note, each of banks 120 exhibits a peak power that extends over a limited portion of the period of memory reference clock 152. Further, upon switching each of banks 120, some level of EMI is generated in relation to the respective bank. By applying a non-zero phase shift between each of sub memory clocks 162, 164, 166, 168, the peak power requirement of memory system 100 can be reduced to substantially less than the peak power requirement of all of banks 120 combined. This is because the peak power requirements of the respective banks 120 are distributed over time, rather than occurring simultaneously as would be the case in a parallel read of banks 120. Of note, while the peak power is reduced, the average power used remains substantially unchanged. Similarly, EMI may be reduced.

Figure 2:
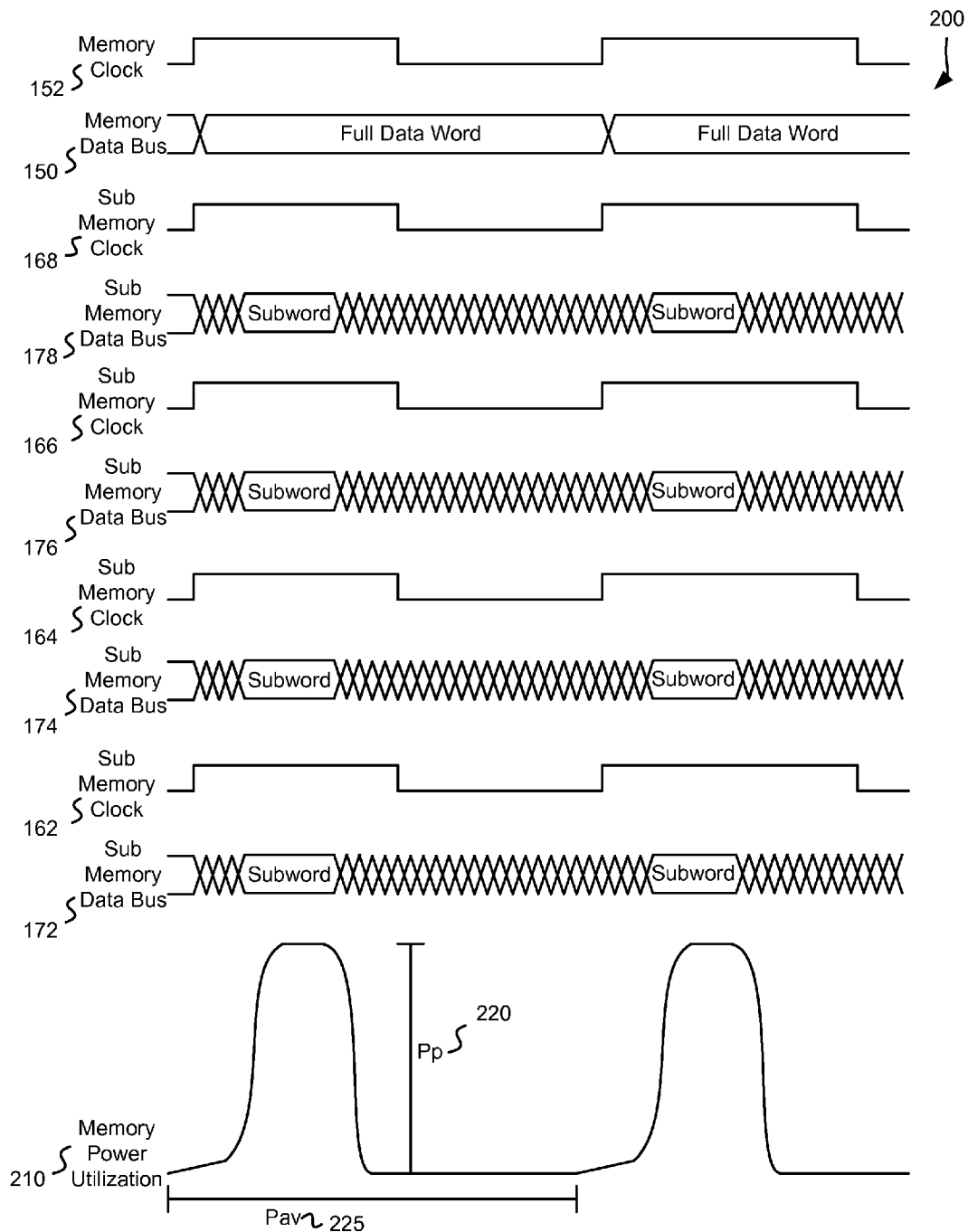
FIG. 2 is a timing diagram depicting an example operation of the memory system of FIG. 1 where the phase between accessing the memory banks is zero in accordance with various embodiments of the present invention.

Turning to FIG. 2, a timing diagram 200 depicts an example operation of the memory system of FIG. 1 where the phase between sub memory clocks is zero. In particular, timing diagram 200 depicts a memory read. A memory write is similar, with the exception of the timing of the data availability on the data buses. Following timing diagram 200, memory reference clock 152 transitions from low to high whenever a new "full data word" is available on memory data bus 150. A full data word is a word having the width equivalent to the aggregate width of banks 120. Each of sub memory clocks 162, 164, 166, 168 are displaced from memory reference clock 152 by zero degrees (i.e., there is no phase offset). Sub memory clock 162 synchronizes data access to bank 120d. As such, data is available from bank 120d on sub memory data bus 172 a defined time from the assertion of sub memory clock 162. Thus, not only is sub memory clock 162 used to cause bank 120d to provide the requested data on sub memory data bus 172, it is used by access control circuit 140 to register the received data to be provided to the requesting device. Similarly, sub memory clock 164 synchronizes data access to bank 120c, and is used by access control circuit 140 to register the received data; sub memory clock 166 synchronizes data access to bank 120b, and is used by access control circuit 140 to register the received data; and sub memory clock 168 synchronizes data access to bank 120a, and is used by access control circuit 140 to register the received data.

Of note, with the phase offset between respective sub memory clocks 162, 164, 166, 168 set at zero degrees, the peak power used by each of bank 120 is aggregated resulting in a relatively high memory power utilization 210 (i.e., the overall power used by the memory at any given time) for a very short portion of the period of memory reference clock 152 corresponding to the times when memory devices 110 of banks 120 are active. The peak power utilization 220 (Pp) then returns to a relatively low value for a substantial portion of the period of memory reference clock 152. This power utilization results in an average power utilization 225 (Pav) over the period of memory reference clock 152.

Figure 3:
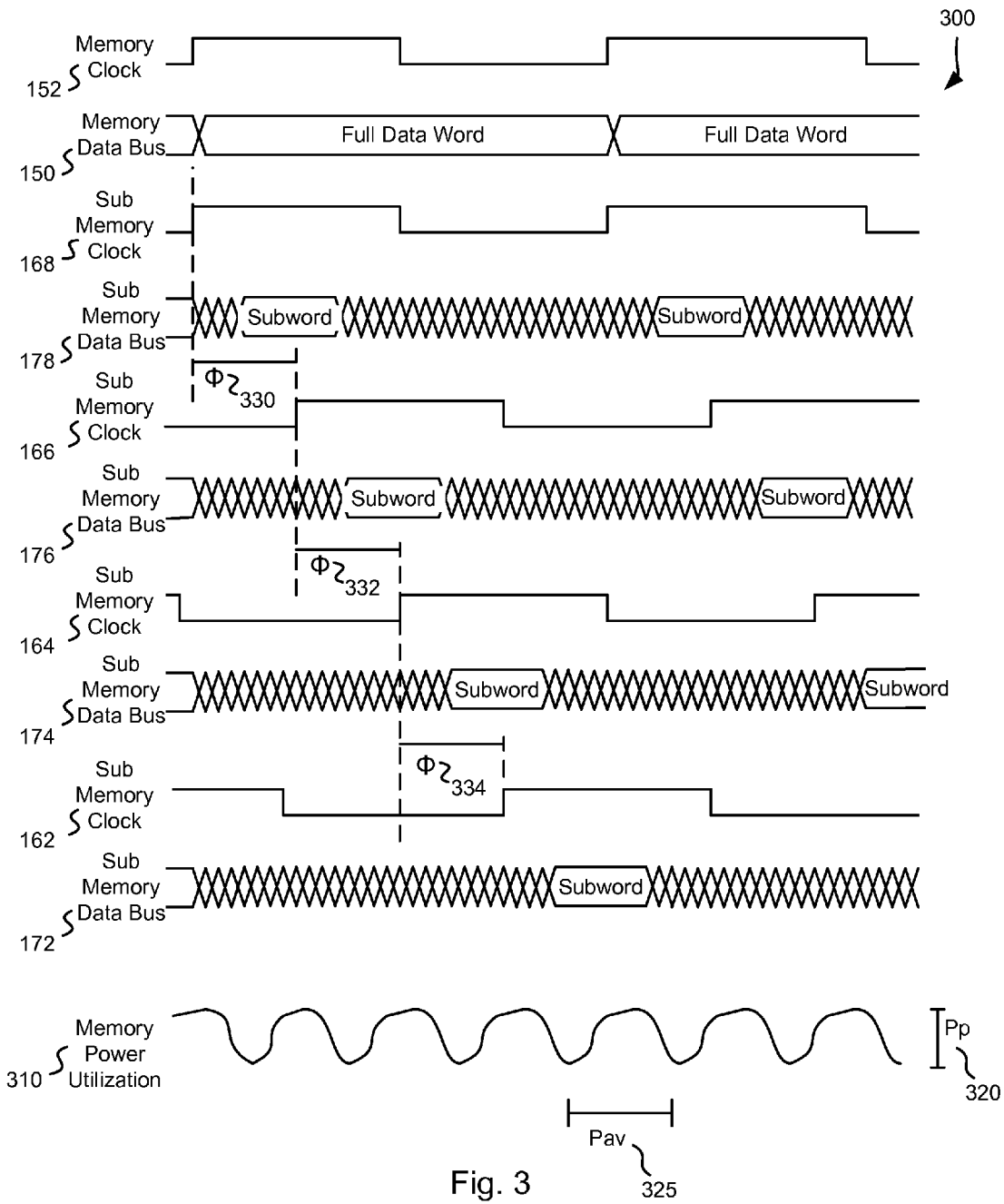
FIG. 3 is a timing diagram depicting an example operation of the memory system of FIG. 1 where the phase between accessing the memory banks is non-zero in accordance with various embodiments of the present invention.

Turning to FIG. 3, a timing diagram 300 depicts an example operation of the memory system of FIG. 1 where the phase (Φ) between sub memory clocks is ninety degrees (i.e., three hundred, sixty degrees divided by the number of banks 120). In particular, timing diagram 300 depicts a memory read. A memory write is similar, with the exception of the timing of the data availability on the data buses. Following timing diagram 300, memory reference clock 152 transitions from low to high whenever a new "full data word" is available on memory data bus 150. A full data word is a word having the width equivalent to the aggregate width of banks 120. Each of sub memory clocks 162, 164, 166, 168 are displaced from memory reference clock 152 by zero degrees (i.e., there is no phase offset). Sub memory clock 162 synchronizes data access to bank 120d. As such, data is available from bank 120d on sub memory data bus 172 a defined time from the assertion of sub memory clock 162. Thus, not only is sub memory clock 162 used to cause bank 120d to provide the requested data on sub memory data bus 172, it is used by access control circuit 140 to register the received data to be provided to the requesting device. Similarly, sub memory clock 164 synchronizes data access to bank 120c, and is used by access control circuit 140 to register the received data; sub memory clock 166 synchronizes data access to bank 120b, and is used by access control circuit 140 to register the received data; and sub memory clock 168 synchronizes data access to bank 120a, and is used by access control circuit 140 to register the received data.

The phase offset between sub memory clock 168 and memory reference clock 152 is zero degrees (i.e., $\Phi*0$); the offset between sub memory clock 166 and memory reference clock 152 is ninety degrees (i.e., $\Phi*1$—depicted as $\Phi$ 330); the phase offset between sub memory clock 164 and memory reference clock 152 is one hundred, eighty degrees (i.e., $\Phi*2$—depicted as $\Phi$ 330 plus $\Phi$ 332); and the offset between sub memory clock 166 and memory reference clock 152 is two hundred, seventy degrees (i.e., $\Phi*3$—depicted as $\Phi$ 330 plus $\Phi$ 332 and $\Phi$ 334). Of note, because the phase offset between sub memory clocks 162, 164, 166, 168 is non-zero, the peak power consumption of memory system 100 is not the aggregate of the peak power consumption of all of banks 120. Rather, a peak power consumption 320 (Pp) is substantially less than the sum of the peak power consumption for banks 120, but is extended over a larger portion of memory reference clock 152. Thus, while the peak power consumption for memory system 100 is substantially reduced when compared to a memory system implementation having a zero phase offset such as that discussed in relation to FIG. 2, the average power 325 (Pay) is approximately the same as that described in relation to FIG. 2. This reduced peak power consumption may make implementation of a memory system less complicated.

Figure 4:
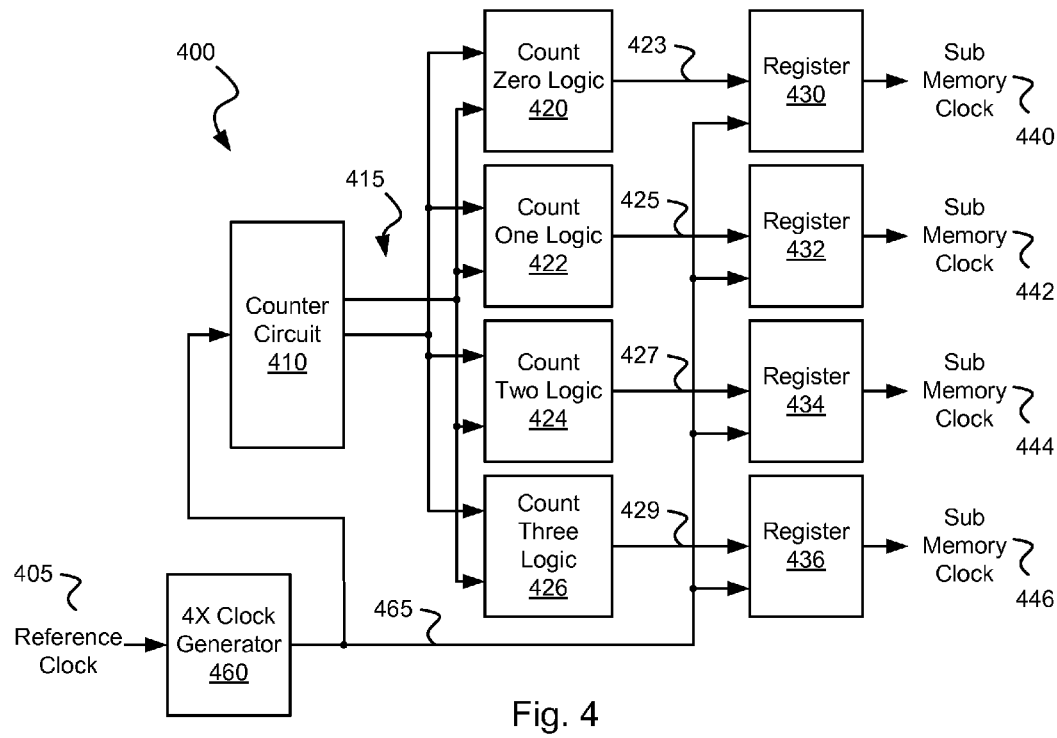
FIG. 4 shows one implementation of an access clock distributor circuit that may be used in relation to one or more embodiments of the present invention.

Turning to FIG. 4, one implementation of an access clock distributor circuit 400 that may be used in relation to one or more embodiments of the present invention is shown. Access clock distributor circuit 400 receives a reference clock 405 that is provided to a clock generator circuit 460. In this case, clock generator circuit 460 produces a 4× clock 465 that may be used to generated four equally spaced phases (i.e., ninety degree phase shifts). A counter circuit 410 continually counts through the number of phases. For each rising edge of reference clock 405, four equally spaced rising edges occur on 4× clock 465 within a defined period (e.g., the period of reference clock 405 where reference clock is a continuous clock exhibiting a defined frequency). Thus, counter circuit provides a two bit output 415 that counts from '00' to '11' with each of the counts representing one of the four phases.

A count zero logic block 420 provides a zero phase output 425 that asserts for the ninety degrees corresponding to a count value of zero. A register 430 registers zero phase output 423 using 4× clock 465 to provide a glitchless zero sub memory clock 440 that may be used to clock a bank of memory. A count one logic block 422 provides a first phase output 425 that asserts for the ninety degrees corresponding to a count value of one. A register 432 registers first phase output 425 using 4× clock 465 to provide a glitchless first sub memory clock 442 that may be used to clock a bank of memory. A count two logic block 424 provides a second phase output 427 that asserts for the ninety degrees corresponding to a count value of two. A register 434 registers second phase output 427 using 4× clock 465 to provide a glitchless second sub memory clock 442 that may be used to clock a bank of memory. A count three logic block 426 provides a third phase output 429 that asserts for the ninety degrees corresponding to a count value of three. A register 436 registers third phase output 429 using 4× clock 465 to provide a glitchless third sub memory clock 446 that may be used to clock a bank of memory.

It should be noted that a variety of access clock distributor circuits may be implemented in accordance with different embodiments of the present invention. For example, a phase shift other than ninety degrees may be used. As another example, more or fewer than four phase shifts may be implemented depending upon the number of banks that are to be staggered using phase shifted sub memory clocks. As a particular example, a number of phase shifts may be implemented using circuit delays where the aggregate of the phase shifts totals less than or equal to three hundred, sixty degrees. In some cases, an access clock distributor circuit may be implemented that offers a programmable number of phase shifted sub memory clocks and/or a programmable phase shift between each of the sub memory clocks. Based upon the disclosure provided herein, one of ordinary skill in the art will appreciate a variety of other implementations of an access clock distributor circuit that may be used in relation to different embodiments of the present invention.

Figure 5:
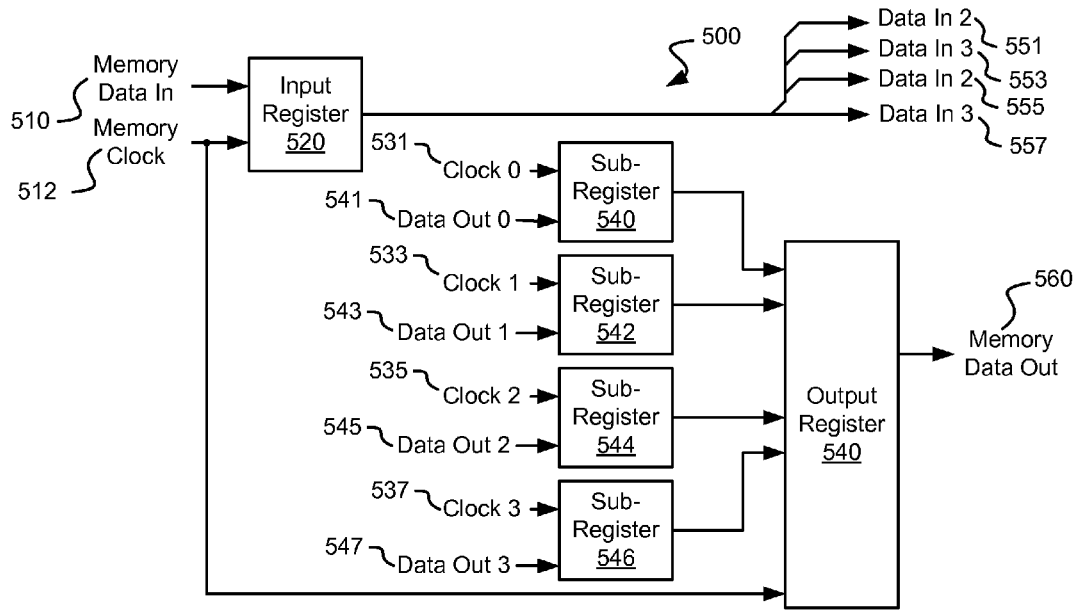
FIG. 5 shows one implementation of an access control circuit that may be used in relation to one or more embodiments of the present invention.

Turning to FIG. 5, one implementation of an access control circuit 500 that may be used in relation to one or more embodiments of the present invention is shown. Access control circuit 500 includes an input register 520 that registers memory data in 510 (i.e., a full data word to be written to the memory system) on each rising edge of memory clock 512 (i.e., the memory clock provided by the host writing the data). The output of input register 520 is electrically coupled to the data buses connected to the respective memory banks (i.e., data in 0 551, data in 1 553, data in 2 555, data in 3 557).

Additionally, access control circuit 500 includes a sub register 540 that registers a data out 0 541 from a first memory bank, using a derivative of the sub memory clock provided to that memory bank (i.e., clock 0 531); a sub register 542 that registers a data out 1 543 from a second memory bank, using a derivative of the sub memory clock provided to that memory bank (i.e., clock 1 533); a sub register 544 that registers a data out 2 545 from a third memory bank, using a derivative of the sub memory clock provided to that memory bank (i.e., clock 2 535); and a sub register 546 that registers a data out 3 547 from a fourth memory bank, using a derivative of the sub memory clock provided to that memory bank (i.e., clock 3 537). An output register 570 receives the outputs from sub registers 540, 542, 544, 546 and registers the outputs upon a rising edge of memory clock 512. The output of output register 570 is provided as a memory data out 560 (i.e., i.e., a full data word read from the memory system).

It should be noted that a variety of access control circuits may be implemented in accordance with different embodiments of the present invention. For example, an access control circuit may be designed to transfer more or fewer than four sub words between four banks. Further, it should be noted that other approaches for aligning sub words that are offset by the implemented phase shift may be implemented in accordance with different embodiments of the present invention. Based upon the disclosure provided herein, one of ordinary skill in the art will appreciate a variety of other implementations of an access control circuit that may be used in relation to different embodiments of the present invention.

Figure 6:
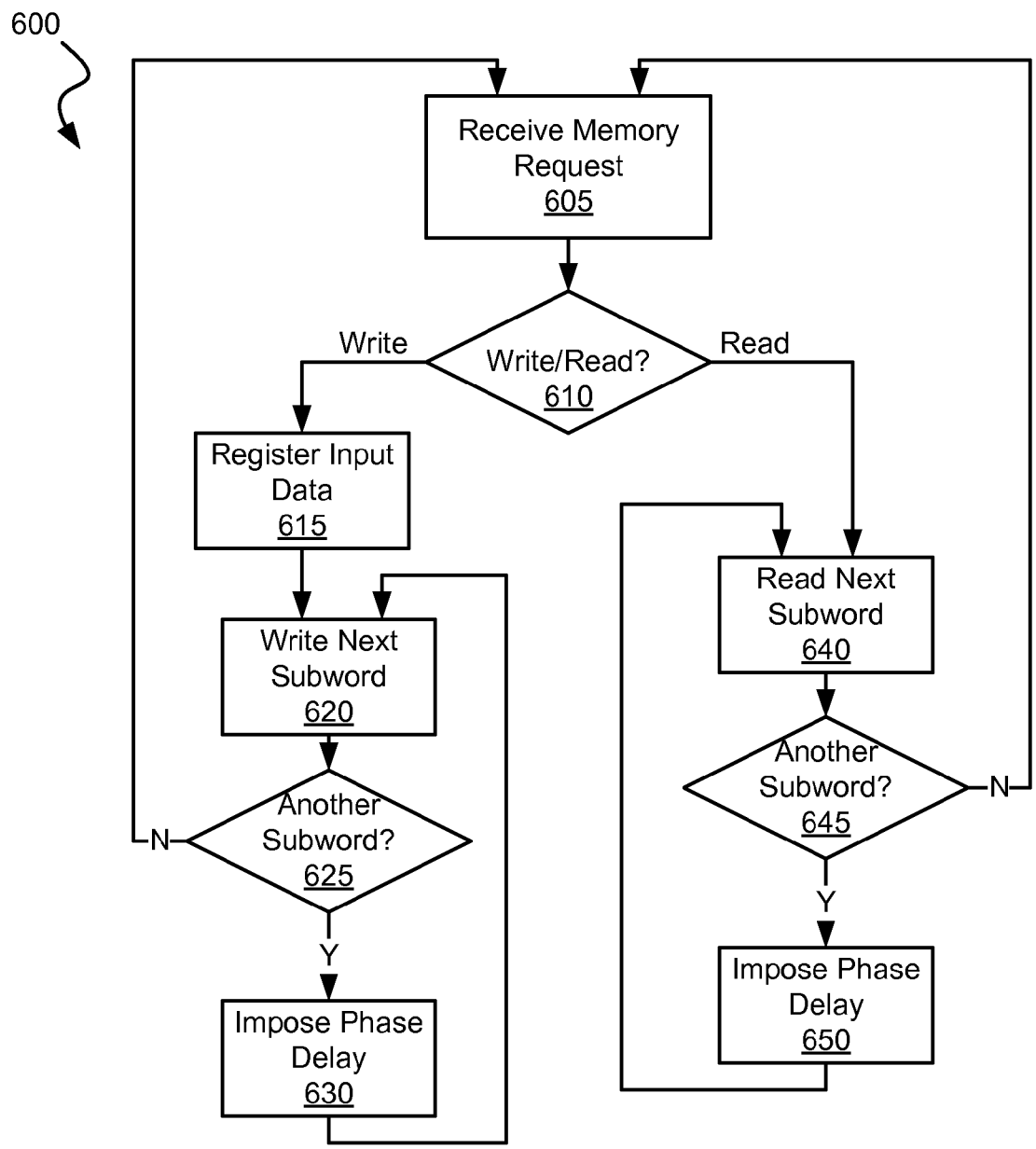
FIG. 6 is a flow diagram showing a method in accordance with one or more embodiments of the present invention for accessing a memory.

Turning to FIG. 6, a flow diagram 600 shows a method in accordance with one or more embodiments of the present invention for accessing a memory. Following flow diagram 600, a memory request is received (block 605). The memory request may be a read in which case an address for the target of the read is provided. Alternatively, the memory request may be a write in which case an address of the target of the write is provided along with data to be written.

Where the memory request is a read (block 610), the next subword is read (block 640). A full data word is made up of a number of subwords where the number of subwords corresponds to the number of banks in the memory system. Where this is the first subword to be read, it is selected as the zero bank by default, although other defaults may be used. The data from the particular address in the bank is transferred from the bank to an access control circuit that prepares the data to be transferred to the requesting host. It is then determined if another subword remains to be read (block 645). A read request includes transferring full data words, and another subword remains to be read when less than all of the subwords comprising the full data word have been read. Where another subword remains to be read (block 645), a phase delay is imposed (block 650) and the next subword is read from its corresponding bank (block 640). The imposed phase delay results in time shifting the peak current utilization of the next bank until sometime after the power usage of the earlier bank has subsided. The subword is then transferred to the access control circuit where it is prepared to be written out to the requesting host. The processes of blocks 640 through 650 are repeated until all subwords corresponding to the full data word have been read and transferred to the access control circuit. Once no subwords remain to be read (block 645), the process is returned to await the next memory request (block 605).

Alternatively, where the memory request is a write (block 610), the received full data word is registered and portions thereof are presented on the respective data busses connecting the banks of the memory system (block 615). Again, a full data word is made up of a number of subwords where the number of subwords corresponds to the number of banks in the memory system. Where this is the first subword to be written, the next subword to be written is selected as the subword presented to the zero bank by default, although other defaults may be used. A sub memory clock is then asserted to the selected bank such that the selected subword is written to the bank (block 620). It is then determined if another subword remains to be written (block 625). A write request includes transferring full data words to the memory system one subword at a time, and another subword remains to be written when less than all of the subwords comprising the full data word have been written. Where another subword remains to be written (block 625), a phase delay is imposed (block 630) and the next subword is written to its corresponding bank (block 615). The imposed phase delay results in time shifting the peak current utilization of the next bank until sometime after the power usage of the earlier bank has subsided. The processes of blocks 620 through 630 are repeated until all subwords corresponding to the full data word have been written to the memory system. Once no subwords remain to be written (block 625), the process is returned to await the next memory request (block 605).

In conclusion, the invention provides novel systems, devices, methods and arrangements for power management and/or EMI reduction in a memory system. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An electronic system, the system comprising:
   at least a first bank of flash memory, wherein the access to the first bank of flash memory is synchronized by a first sub memory clock;
   a second bank of flash memory, wherein the access to the second bank of flash memory is synchronized by a second sub memory clock; and
   an access clock distributor circuit that is operable to provide the first sub memory clock to the first bank of flash memory and to provide the second sub memory clock to the second flash memory, wherein the second sub memory clock at the output of the access clock distributor circuit lags the first sub memory clock at the output of the access clock distributor circuit by a phase offset.

2. The electronic system of claim 1, wherein the first bank of flash memory comprises a plurality of flash memory devices.

3. The electronic system of claim 1, wherein the access clock distributor circuit is operable to receive a reference clock, and wherein the access clock distributor circuit is operable to assert the first sub memory clock and the second sub memory clock relative to the reference clock.

4. The electronic system of claim 3, wherein the phase offset is a function of a total number of banks that are accessed in phases and a period of the reference clock.

5. The electronic system of claim 4, wherein the phase offset is approximately three hundred sixty degrees divided by the total number of banks that are accessed in phases.

6. The system of claim 3, wherein the phase offset is selected to represent a greater duration of the reference clock than the duration over which the peak power requirement of the first bank of flash memory extends.

7. The system of claim 1, wherein the phase offset is selected such that a peak power requirement of the first bank of flash memory and a peak power requirement of the second bank of flash memory do not overlap in time.

8. The system of claim 1, wherein the system further includes:
   an access control circuit that is operable to align data received from the first bank of flash memory and the second bank of flash memory.

9. The system of claim 8, wherein the system further includes:
   a host that is operable to receive data read from the first bank of flash memory and the second bank of flash memory via the access control circuit, and is operable to provide data to the first bank of flash memory and the second bank of flash memory via the access control circuit.

10. The electronic system of claim 1, wherein the phase offset is non-zero.

11. A method for memory system access, the method comprising:
   providing a first bank of memory;
   providing a second bank of memory;
   receiving a memory access request, wherein the memory access request includes assertion of a reference memory clock;

accessing the first bank of memory using a first sub memory clock asserted relative to the reference memory clock;

delaying a phase offset;

accessing the second bank of memory using a second sub memory clock asserted the phase offset after assertion of the first sub memory clock;

receiving a first output from the first bank of memory;

receiving a second output from the second bank of memory; and aligning the first output and the second output to yield a subset of a full data word.

12. The method of claim 11, wherein the phase offset is a function of a total number of banks that are accessed in phases and a period of the reference memory clock.

13. The method of claim 12, wherein the phase offset is approximately three hundred sixty degrees divided by the total number of banks that are accessed in phases.

14. The method of claim 11, wherein the phase offset is selected to represent a greater duration of the reference memory clock than the duration over which the peak power requirement of the first bank of memory extends.

15. The method of claim 11, wherein the phase offset is selected such that a peak power requirement of the first bank of memory and a peak power requirement of the second bank of memory do not overlap.

16. A memory circuit, the memory circuit comprising:

a first bank of memory and a first sub memory clock, wherein the first bank of memory is accessible using the first sub memory clock;

a second bank of memory and a second sub memory clock, wherein the second bank of memory is accessible using the second sub memory clock; and an access clock distributor circuit that is operable to receive a reference memory clock, and wherein the access clock distributor circuit is operable to assert the first sub memory clock relative to the reference memory clock and to assert the second sub memory clock a phase offset from the first sub memory clock.

17. The memory circuit of claim 16, wherein the phase offset is a function of a total number of banks that are accessed in phases and a period of the reference memory clock.

18. The memory circuit of claim 16, wherein the phase offset is selected to represent a greater duration of the reference memory clock than the duration over which the peak power requirement of the first bank of memory extends.

19. The memory circuit of claim 16, wherein the phase offset is selected such that a peak power requirement of the first bank of memory and a peak power requirement of the second bank of memory do not overlap.

20. The memory circuit of claim 16, the memory circuit further comprising:

an access control circuit that is operable to align data received from the first bank of flash memory and the second bank of flash memory.

\* \* \* \* \*